United States Patent
Chen et al.

(10) Patent No.: US 9,755,667 B1
(45) Date of Patent: Sep. 5, 2017

(54) METHODS AND SYSTEMS FOR PARALLELIZING HIGH THROUGHPUT ITERATIVE DECODERS

(71) Applicant: Marvell International Ltd., Hamilton (BM)

(72) Inventors: Jie Chen, Milpitas, CA (US); Haoting Luo, Milpitas, CA (US); Engling Yeo, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 190 days.

(21) Appl. No.: 14/712,465

(22) Filed: May 14, 2015

Related U.S. Application Data

(60) Provisional application No. 61/994,521, filed on May 16, 2014.

(51) Int. Cl.
  *H03M 13/37* (2006.01)
  *H03M 13/00* (2006.01)
  *H03M 13/53* (2006.01)

(52) U.S. Cl.
  CPC ..... *H03M 13/3746* (2013.01); *H03M 13/616* (2013.01)

(58) Field of Classification Search
  CPC ......... H03M 13/3746; H03M 13/3784; H03M 13/616; G06F 11/1076; G06F 11/1008
  See application file for complete search history.

(56) References Cited

U.S. PATENT DOCUMENTS

| | | | |
|---|---|---|---|
| 2008/0304464 A1* | 12/2008 | Borkar | H04B 7/0434 370/342 |
| 2010/0107030 A1* | 4/2010 | Graef | H03M 13/1111 714/752 |
| 2011/0029839 A1* | 2/2011 | Zhong | H03M 13/098 714/763 |

* cited by examiner

*Primary Examiner* — April Y Blair
*Assistant Examiner* — Dipakkumar Gandhi

(57) ABSTRACT

Methods and systems are disclosed for decoding codewords, wherein codewords comprise at least one circulant and are stored in a first dimension of a matrix, and wherein each circulant in a codeword is associated with a location in a second dimension in the matrix. The method includes determining whether a first location in a second dimension of a first circulant of a first codeword corresponds to a second location in the second dimension of a second circulant of a second codeword. The method includes, in response to determining that the first location does not correspond to the second location, decoding the first and second circulant with a first decoding process. The method includes, in response to determining that the first location corresponds to the second location, decoding the first and second circulant with a second decoding process.

20 Claims, 6 Drawing Sheets

600

602

DETERMINE WHETHER A FIRST LOCATION IN A SECOND DIMENSION OF A FIRST CIRCULANT OF A FIRST CODEWORD CORRESPONDS TO A SECOND LOCATION IN THE SECOND DIMENSION OF A SECOND CIRCULANT OF A SECOND CODEWORD

604

IN RESPONSE TO DETERMINING THAT THE FIRST LOCATION DOES NOT CORRESPOND TO THE SECOND LOCATION, DECODING THE FIRST CIRCULANT AND THE SECOND CIRCULANT IN ACCORDANCE WITH A FIRST DECODING PROCESS

606

IN RESPONSE TO DETERMINING THAT THE FIRST LOCATION CORRESPONDS TO THE SECOND LOCATION, DECODING THE FIRST CIRCULANT AND THE SECOND CIRCULANT IN ACCORDANCE WITH A SECOND DECODING PROCESS

FIG. 6

METHODS AND SYSTEMS FOR PARALLELIZING HIGH THROUGHPUT ITERATIVE DECODERS

CROSS REFERENCE TO RELATED APPLICATION

This disclosure claims the benefit under 35 U.S.C. §119(e) of U.S. Provisional Application No. 61/994,521, filed on May 16, 2014, which is incorporated herein by reference in its entirety.

FIELD OF USE

This disclosure related to methods and systems for bit-flipping decoder architectures using parallelization to increase throughput by processing multiple circulants simultaneously.

BACKGROUND OF THE DISCLOSURE

Traditional bit-flipping (BF) decoders process codewords one circulant at a time. Hence, traditional BF decoders' throughput is limited by their circulant size. Traditional methods for increasing the throughput of these BF decoders may require an increase in clock speed. However, increasing clock speed can lead to an increase in power consumption, which may be undesirable. Traditional BF decoders may cause high power consumption due to their frequent memory accesses while reading from or writing to memories associated with these decoders.

SUMMARY

In accordance with an embodiment of the present disclosure, a method is provided for decoding codewords, wherein the codewords include circulants and are stored in a first dimension of a matrix, and wherein each circulant in a codeword is associated with a location in a second dimension in the matrix. The method may include determining whether a first location in a second dimension of a first circulant of a first codeword corresponds to a second location in the second dimension of a second circulant of a second codeword. The method may include, in response to determining that the first location does not correspond to the second location, decoding the first and second circulants with a first decoding process. The method may include, in response to determining that the first location corresponds to the second location, decoding the first and second circulants with a second decoding process.

One or more implementations of the present disclosure may provide one or more of the following advantages. In some implementations, determining whether the first location corresponds to the second location may include comparing a first address of the first location to a second address of the second location. In some implementations, the first decoding process may include receiving a third circulant of the first codeword, generating flips in the first circulant based on an instant syndrome and the third circulant, and storing the first circulant. In some implementations, the first decoding process may include generating a current instant syndrome based on an old received instant syndrome and the first circulant with flips. In some implementations, the method may include decoding the first and second codewords in parallel with odd and even parts of the circuitry respectively. In some implementations, the second decoding process may include generating a combined current instant syndrome based on an odd and an even current instant syndrome. In some implementations, the second decoding process may include determining if a first offset for an odd current instant syndrome corresponds to a second offset for an even current instant syndrome, and generating a combined instant syndrome based on one of the odd and even current instant syndromes if it does. In some implementations, the method may include determining if the first circulant has been flipped based on a value of a flag, and retrieving a third circulant of the first codeword if it has. In some implementations, the method may include generating a threshold value based a value of a flag for the first circulant, and determining whether to flip the first circulant based on the threshold value. In some implementations, the method may include receiving the first and second circulants simultaneously from odd and even portions of a memory respectively through a data path.

In accordance with an embodiment of the present disclosure, a system is provided for decoding codewords, wherein the codewords include circulants and are stored in a first dimension of a matrix, and wherein each circulant in a codeword is associated with a location in a second dimension in the matrix. The system may include storage circuitry configured to store a first circulant of a first codeword and a second circulant of a second codeword. The system may include control circuitry configured to determine whether a first location in a second dimension of a first circulant of a first codeword corresponds to a second location in the second dimension of a second circulant of a second codeword. The system may include control circuitry configured to, in response to determining that the first location does not correspond to the second location, decode the first and second circulants with a first decoding process. The system may include control circuitry configured to, in response to determining that the first location corresponds to the second location, decode the first and second circulants with a second decoding process.

One or more implementations of the present disclosure may provide one or more of the following advantages. In some implementations, control circuitry configured to determine whether the first location corresponds to the second location may be further configured to compare a first address of the first location to a second address of the second location. In some implementations, the first decoding process may include control circuitry configured to receive a third circulant of the first codeword, generate flips in the first circulant based on an instant syndrome and the third circulant, and store the first circulant. In some implementations, the first decoding process may include control circuitry configured to generate a current instant syndrome based on an old received instant syndrome and the first circulant with flips. In some implementations, the system may include control circuitry configured to decode the first and second codewords in parallel with odd and even parts of the circuitry respectively. In some implementations, the second decoding process may include control circuitry configured to generate a combined current instant syndrome based on an odd and an even current instant syndrome. In some implementations, the second decoding process may include control circuitry configured to determine if a first offset for an odd current instant syndrome corresponds to a second offset for an even current instant syndrome, and generate a combined instant syndrome based on one of the odd and even current instant syndromes if it does. In some implementations, the system may include control circuitry configured to determine if the first circulant has been flipped based on a value of a flag, and retrieve a third circulant of the first codeword if it has. In some implementations, the system may include control circuitry configured to generate a threshold value based a value of a flag for the first circulant, and determine whether to flip the first circulant based on the threshold value. In some implementations, the system may include control circuitry configured to receive the first and second circulants simultaneously from odd and even portions of a memory respectively through a data path.

BRIEF DESCRIPTION OF DRAWINGS

Further features of the disclosure, its nature, and various advantages, will be apparent upon consideration of the following detailed description, taken in conjunction with the accompanying drawings, in which:

FIG. 6 shows a flow diagram of a process for decoding codewords, in accordance with some embodiments of the present disclosure.

DETAILED DESCRIPTION

To provide an overall understanding of the disclosure, certain illustrative embodiments will now be described, including methods and systems for parallelizing high throughput iterative decoders. However, the methods and systems described herein may be adapted and modified as is appropriate for the application being addressed, and the methods and systems described herein may be employed in other suitable applications.

Figure 1:
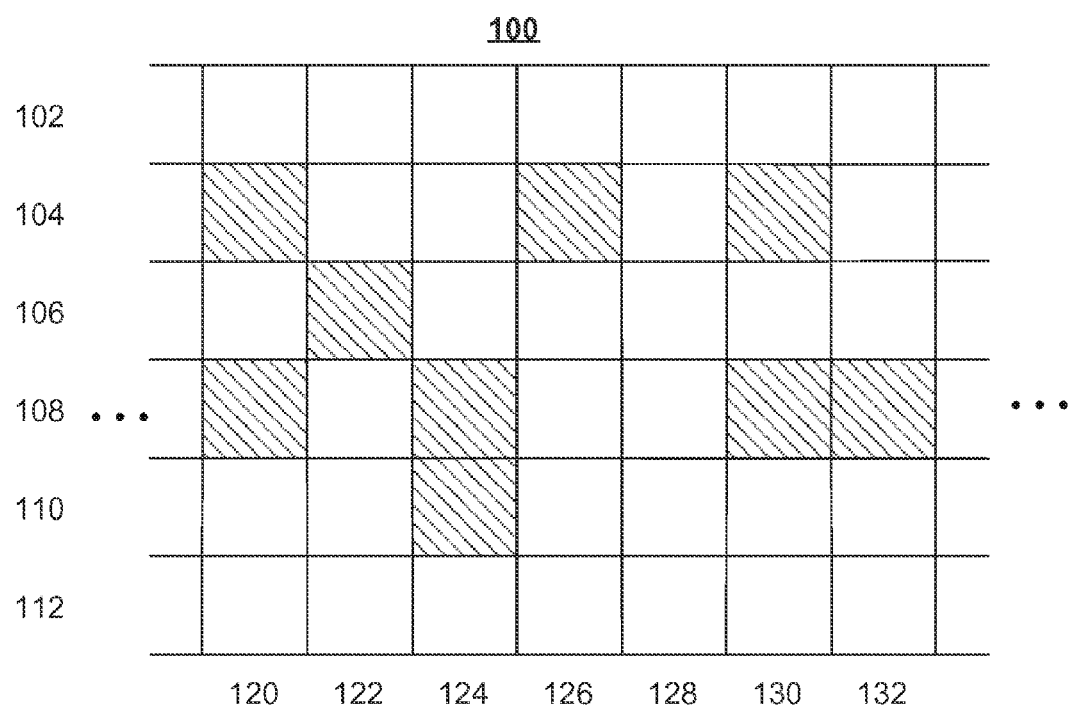
FIG. 1 shows an illustrative memory structure containing codewords and circulants, in accordance with some embodiments of the present disclosure.

FIG. 1 shows an illustrative memory structure containing codewords and circulants incorporating elements of the present disclosure. Grid 100 depicts the memory as a matrix with rows and columns. Each block at an intersection of a row and a column in grid 100 represents a circulant. As referred to herein, a circulant is the smallest unit a decoder may process. A codeword is comprised of circulants, and a decoder may decode a codeword by decoding its component circulants. A codeword may contain any integer number of circulants, or no circulants at all. Although grid 100 is discussed as having codewords represented as columns, it is understood that codewords may be represented as rows without departing from the scope of the disclosure.

Shaded blocks in grid 100 represent non-zero circulants that need to be decoded. For example, the block in row 104 and column 120 is a non-zero circulant. Unshaded blocks in grid 100 represent circulants that do not need to be decoded. For example, the block in row 102 and column 120 is a circulant that does not need to be decoded.

Grid 100 has six rows: rows 102, 104, 106, 108, 110, and 112. Each row may be associated with a row number. For example, row 102 may be numbered "0", row 104 may be numbered "1", row 106 may be numbered "2", and so on.

Grid 100 has many columns, only seven of which are labeled in FIG. 1: columns 120, 122, 124, 126, 128, 130, and 132. Each column may be associated with a column number. For example, column 120 may be numbered "2", column 122 may be numbered "3", column 124 may be numbered "4", and so on. A row number may be repeated as a column number. For example, both row 106 and column 120 may be numbered "2". Each row and column may also correspond to a row address and a column address respectively, which describe its location in a memory such as raw memories 216 and 516 or current memories 202 or 502. It is understood that grid 100, and the memory it represents, may have any number of rows or columns. Each circulant is located in a single row and a single column. Not all circulants shown in FIG. 1 are the same size.

Traditional bit-flipping (BF) decoders may decode the circulants in grid 100 one column at a time. That is, a traditional BF decoder may decode circulants in column 120, and then decode circulants in column 122, and then decode circulants in column 124, and so on. A traditional BF decoder may decode a single column in each cycle, or may take multiple cycles to decode each column. In some embodiments, the BF decoder may decode a circulant in each cycle. The BF decoder calculates an instant syndrome at the end of decoding each column. This calculated instant syndrome may be used to update a stored instant syndrome memory. The updated instant syndrome may be used to calculate flips that need to be applied to the next circulants to decode them without errors.

As referred to herein, the throughput of a BF decoder refers to the amount of data it decodes in a given amount of time. In the traditional BF decoder design, throughput is limited by the circulant size. This is because since only one column is processed at a time, the throughput depends on the size of the circulants in the column. For example, if column 120 contained circulants of a large size, the throughput of a traditional decoder would be higher than if column 120 contained circulants of a small size. However, a traditional BF decoder may only be able to decode circulants of a fixed size. Another method to increase throughput of traditional BF decoders is to increase the clock speed. This may allow each column to be decoded faster. However, increasing clock speed may also increase the power consumption of the decoder. Increasing the clock speed may also cause more frequent memory access by the BF decoder, which may also increase the power consumption of the BF decoder.

Parallelizing the BF decoder may allow the throughput to be increased without causing an increase in power consumption or big design changes. It may allow for a low latency, low power, low area, high throughput and scalable decoder design without any degradation of the decoding performance. A parallelized BF decoder may even perform decoding at a lower clock speed than a traditional BF decoder and achieve a higher or similar throughput with lower power consumption. A parallelized BF decoder may increase its data bandwidth to increase the data processed in each cycle without a corresponding change in clock cycle frequency. A parallelized BF decoder may process multiple circulants in the same clock cycle. A parallelized BF decoder may calculate and update more flipping decisions in a cycle to achieve faster convergence to error free decoded circulants faster.

In a parallelized BF decoder, multiple columns may be decoded simultaneously. Although this disclosure discusses a parallelization level of two, the methods and systems described in this disclosure can be scaled to any level of parallelization. For example, if a BF decoder has a parallelization level of M=2, it may decode two columns simultaneously. The parallelized BF decoder may decode columns 122 and 124 simultaneously, and then decode columns 126 and 128 simultaneously, and then decode columns 130 and 132 simultaneously. An instant syndrome is calculated at the end of decoding each group of columns. For example, an instant syndrome may be updated after the circulants in columns 122 and 124 are decoded. This calculated instant syndrome may be used to update a stored instant syndrome memory, and simultaneously may be used to calculate flips that need to be applied to the next circulants to decode them without errors.

In some embodiments, circulants from different rows may be decoded simultaneously. For example, a parallelized BF decoder decoding columns 122 and 124 may determine that rows 102 and 104 contain no non-zero circulants for either column. The decoder may further determine that row 106 contains a non-zero circulant for column 122 while row 108 contains a non-zero circulant for column 124. The decoder may further determine that row 108 does not contain a non-zero circulant for column 122, while row 106 does not contain a non-zero circulant for column 124. The decoder may then decode the circulant in row 106 and column 122 and the circulant in row 108 and column 124 simultaneously.

A challenge of decoding grid 100 in a parallelized manner is managing circulants that belong to the same row in the same clock cycle. For example, a parallelized BF decoder may decode columns 130 and 132 simultaneously. The parallelized BF decoder may decode row 102 at a first clock cycle, row 104 at a second clock cycle, row 106 at a third clock cycle, and so on, for columns 130 and 132. In some embodiments, the parallelized BF decoder may decode the first non-zero circulant in column 122 at row 106 in the same clock cycle as the first non-zero circulant in column 124 at row 108. Row 108 for columns 130 and 132 contains two circulants, one for each of the columns. The parallelized BF decoder may decode the circulants in columns 130 and 132 at row 108 in the same clock cycle. In this situation, the parallelized BF decoder may need to manage the intermediate results of decoding each of these circulants simultaneously to calculate the correct instant syndrome for columns 130 and 132. Another challenge of parallelizing decoding is managing an expanded data path so multiple circulants can be processed simultaneously using the same circuitry. Yet another challenge of parallelizing decoding is managing the increased calculation power so that calculations still happen in the correct order and produce correct results.

Figure 2:
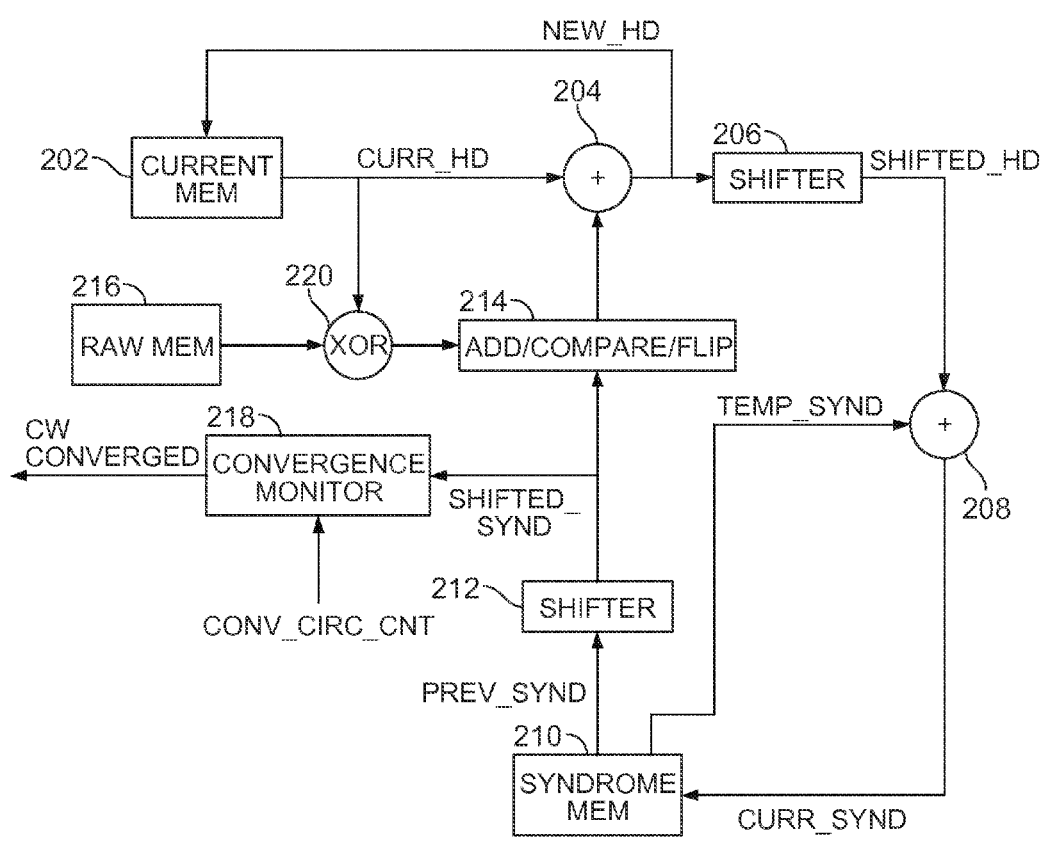
FIG. 2 shows a block diagram of conventional decoder, in accordance with some embodiments of the present disclosure.

FIG. 2 shows a block diagram of conventional decoder 200 incorporating some embodiments of the present disclosure. Arrows in decoder 200 depict data paths that carry data from one element of decoder 200 to another. Decoder 200 contains three types of memories. Accessing each of these memories by reading from and writing to them may increase power consumption. Hence, it may be desirable to reduce the memory accesses associated with each of these memories. Raw memory 216 contains the raw data for decoding. Data in raw memory 216 may be the data represented in grid 100 described in relation to FIG. 1. Data may be read from raw memory 216 to provide the initial input to decoder 200. The circulants in this data may then have their information flipped and decoded. In some embodiments, raw memory 216 may only be read from, and not written to, during decoding.

Current memory 202 may contain intermediate decoding results for hard decisions. Current memory 202 may be updated after each cycle of decoding performed by decoder 200. Current memory 202 may be the same size as raw memory 216, and may be arranged to have the same dimensions and layout.

Syndrome memory 210 may contain information about syndromes. Syndrome memory 210 may contain instant syndromes calculated during each cycle of decoding performed by decoder 200. The data in syndrome memory 210 may be used to calculate convergence to indicate when circulants can be decoded without errors. Syndrome memory 210 and current memory 202 may be updated each cycle to store the most updated instant syndrome and circulants respectively.

Decoder 200 may begin decoding a circulant by reading the circulant from raw memory 216. Flipping module 214 may receive the circulant from raw memory 216 as well as a shifted syndrome "SHIFTED_SYND" and use this information to flip the appropriate bits in the circulant. This flipped circulant "NEW_HD" may be stored in current memory 202 if convergence monitor 218 indicates that convergence has not yet been reached. This may happen in the case of a circulant whose decoding involves many hard decisions and hence, multiple decoding cycles in decoder 200. The flipped circulant "NEW_HD" may be shifted by shifter 208 to result in "SHIFTED_HD", which may be combined with a temporary instant syndrome from a previous cycle "TEMP_SYND" by adder 208. This may result in a current syndrome "CURR_SYND" that is stored in syndrome memory 218, to be used during the next cycle of decoding. In the next cycle, the stored syndrome from the previous cycle "PREV_SYND" may be shifted by shifter 212 to result in "SHIFTED_SYND" which is used by flipping module 214 and convergence monitor 218.

In some embodiments, if convergence monitor 218 indicates that convergence has not yet been reached, and additional decoding is needed for an intermediate result stored in current memory 202, exclusive-or element 220 may select a circulant "CURR_HD" from current memory 202 instead of a circulant from raw memory 216 to be used by flipping module 214. The resulting flipped circulant may be combined with the current circulant "CURR_HD" from current memory 202 by adder 204 to create an updated flipped circulant "NEW_HD". The updated flipped circulant "NEW_HD" may then be stored in current memory 202.

In some embodiments, a circulant from raw memory 216 and its updated flipped version from current memory 202 may be combined using exclusive-or element 220. For example, exclusive-or element 220 may combine the current circulant "CURR_HD" from current memory 202 and the original version of the circulant from raw memory 216 to be used by flipping module 214. The resulting flipped circulant may then be stored in current memory 202.

Raw memory 216 may have dimensions of n*Sc, where n is the number of circulants of the longest codeword present in raw memory 216, and Sc is the size of a circulant. In some embodiments, if the size of each circulant is different, Sc may be the size of the largest circulant in raw memory 216. Current memory 202 may also have dimensions of n*Sc. Syndrome memory 210 may have dimensions of p*Sc, where p is the number of circulants of the longest parity present in raw memory 216. Shifters 206 and 212 may be the size of the column weight of the data being decoded. For example, grid 100 may have a column weight of four, because there may be a maximum of four non-zero circulants in every column. If the data in raw memory 216 corresponds to the data illustrated in grid 100, then shifters 206 and 212 will have a size of four. In some embodiments, shifters 206 and 212 may have a size based on the column weight, such as an integer multiple of the column weight.

Figure 3:
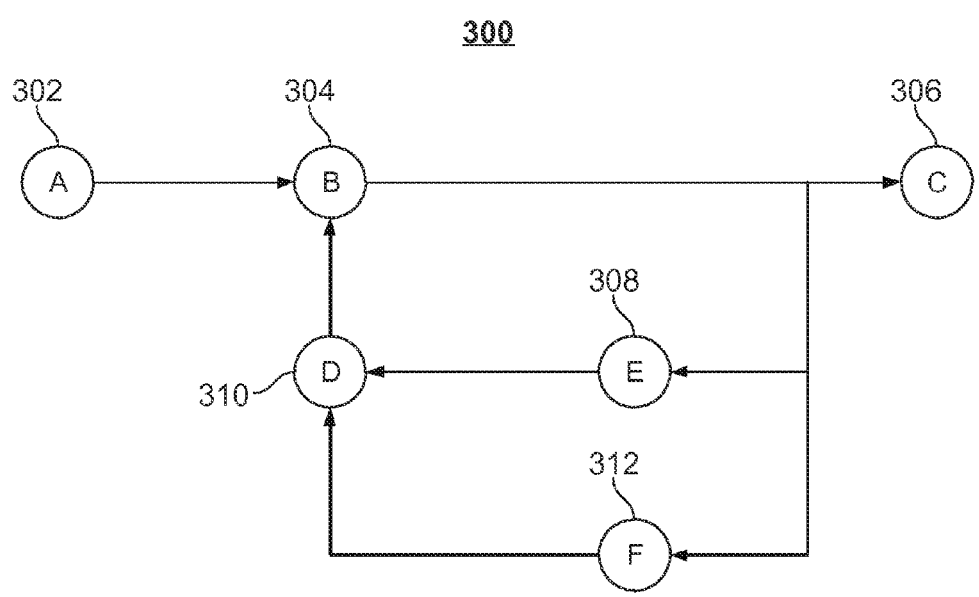
FIG. 3 shows a simplified block diagram of a conventional decoder, in accordance with some embodiments of the present disclosure.

FIG. 3 shows a simplified block diagram of conventional decoder 200 incorporating embodiments of the present disclosure. Simplified decoder 300 illustrates the two loops of data processing that are present in decoder 200. The first loop is the transfer of data from B 304 to F 312 to D 310 and back to B 304. The second loop is the transfer of data from B 304 to E 308 to D 310 and back to B 304.

In decoder 300, A 302 represents flipping module 214. B 304 represents syndrome memory 210. C 306 represents current memory 202. E 308 represents the temporary syndrome that adder 208 receives from syndrome memory 210. F 312 represents the shifted flipped circulant adder 208 receives from shifter 206. D 310 represents the current syndrome that is calculated by adder 208 and stored in syndrome memory 210.

The first loop from B 304 to F 312 to D 310 and back to B 304 represents the circulant being updated using the shifted syndrome "SHIFTED_SYND" by flipping module 214. The flipped circulant "NEW_HD" is then stored in current memory 202, and is also used to calculate a current syndrome value "CURR_HD". The second loop from B 304 to E 308 to D 310 and back to B 304 represents the calculation of a current syndrome value "CURR_SYND" by combining a temporary syndrome value from a previous cycle "TEMP_SYND" with the shifted circulant "SHIFTED_HD" at adder 208.

The first loop may contain non-linear calculation elements, such as flipping module 214. Both the first loop and the second loop may be data processing loops that happen in every cycle of decoding. Parallelizing BF decoding may require performing the first and the second loop in parallel for two circulants. However, the instant syndrome "CURR_HD" calculated by the parallel elements may need to take into account information from the other parallel computations, for example, when non-zero circulants are decoded in parallel at the same time. The critical path of the data needs to be taken into account to ensure there will be no incorrect updates due to pipelining when updating information in the memories in decoder 200. A look-ahead parallel design is proposed, as shown in FIG. 4, to parallelize the loops discussed in relation to decoder 300 without increasing the clock speed or causing errors due to pipelining.

Figure 4:
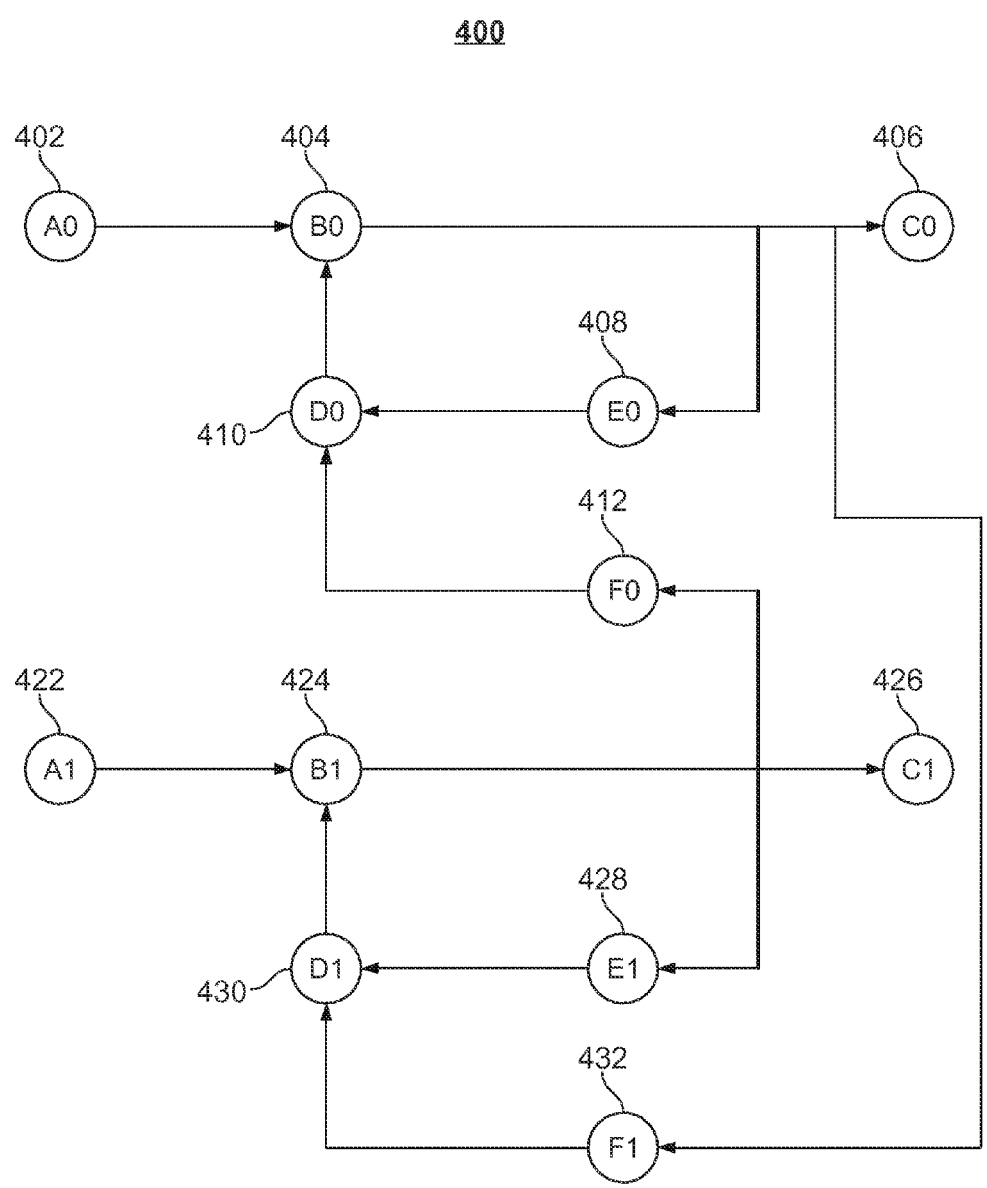
FIG. 4 shows a simplified block diagram of a parallelized decoder, in accordance with some embodiments of the present disclosure.

FIG. 4 shows a simplified block diagram of a parallelized decoder 400 incorporating some embodiments of the present disclosure. Although only two parallel circuits are shown, it is understood that the look-ahead parallel design may be scaled to any number of parallel decoders in accordance with the present disclosure. The throughput of decoder 400 may increase in proportion to the parallelization level. For example, a parallelization level of M=2 is shown in FIG. 4, and this may cause throughput to increase by a factor of 2. Different parallelization levels may allow for the parallel circuits to be optimized in different ways to take advantage of the redundancy of each computation node and reduce the area associated with the design. Illustrated decoder 400 does not require a different frequency from that used in conventional decoder 200, which allows for the LDPC code design to be relaxed.

Although A0 402 and A1 422 have been illustrated as being different elements, they may be implemented as a single element with a connection to two parallel circuits for processing circulants in parallel. Similarly, pairs B0 404 and B1 424, C0 406 and C1 426, and D0 410 and D1 430 may be combined with each other in embodiments of the present disclosure.

Decoder 400 illustrates that a temporary syndrome from the top circuit may be used by both the top circuit through E0 408 and the bottom circuit through F1 432 to calculate a current syndrome. Similarly, a temporary syndrome from the bottom circuit may be used by both the top circuit through F0 412 and the bottom circuit through E1 428 to calculate a current syndrome. This allows the instant syndrome calculated for the circulants processed by each part of the circuit in parallel to use information from current syndromes of other circulants being processed in parallel.

Figure 5:
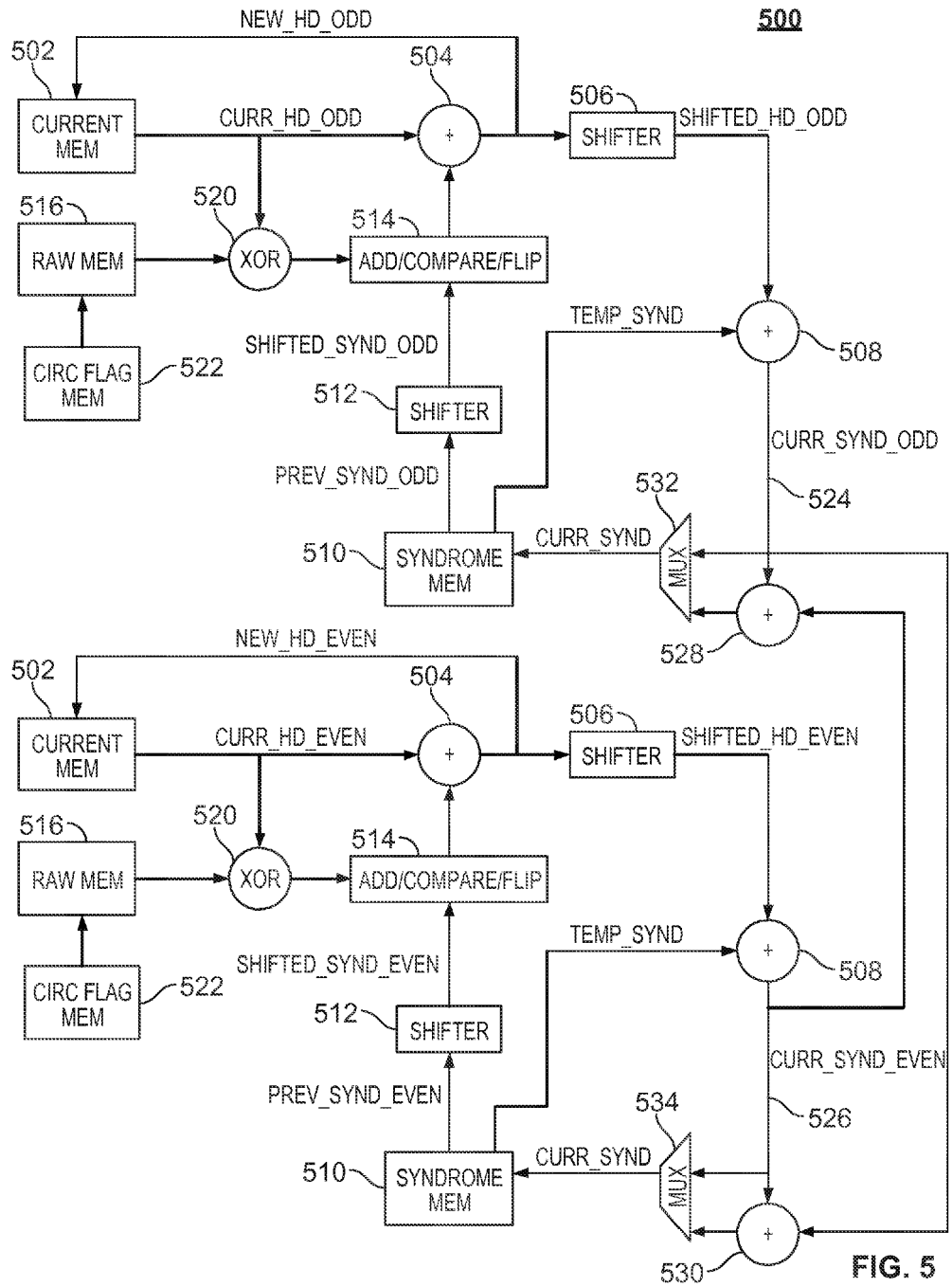
FIG. 5 shows a block diagram of a parallelized decoder, in accordance with some embodiments of the present disclosure.

FIG. 5 shows a block diagram of a parallelized decoder incorporating some embodiments of the present disclosure. Parallelized BF decoder is an embodiment of the design shown in decoder 400. Other embodiments of the design shown in decoder 400 are also possible, and within the scope of this disclosure. Decoder 500 is an embodiment of decoder 200 with a parallelization level of M=2. The design of decoder 500 can be generalized to other parallelization levels. A convergence monitor is not shown in decoder 500 for the sake of simplicity, but one would work as described in relation to convergence monitor 218 in decoder 200.

Decoder 500 is similar to decoder 200. Decoder 500 has an odd and an even part which may process circulants in parallel. The top half of decoder 500 illustrates the odd part of decoder 500 which may decode a first circulant such as "CURR_HD_ODD", while the bottom half of decoder 500 illustrates the even part of decoder 500 which may decode a second circulant such as "CURR_HD_EVEN" in parallel with the first circulant. It is understood that decoder 500 may be scaled to decode any number of circulants in parallel in accordance with the present disclosure. Decoder 500 functions in largely the same manner as decoder 200, except for some changes made to enable parallelization, which are discussed in greater detail below.

Current memory 502, syndrome memory 510 and raw memory 516 are shared by both the odd and even parts of decoder 500. These memory elements may correspond to current memory 202, syndrome memory 210, and raw memory 216 respectively as discussed in relation to FIG. 2. Memories 502, 510, and 516 in decoder 500 may be split into odd and even sections to allow for parallel processing of circulants. This may allow for accessing multiple circulants simultaneously in the memories.

The dimensions of the memories may also be changed to allow for parallel processing of circulants. Raw memory 516 may have dimensions (n/M)*(M*Sc), where n is the number of circulants of the longest codeword, M is the parallelization level which is M=2 for the illustrative decoder 500, and Sc is the size of a circulant as discussed in relation to FIG. 2. As can be seen, the total size of raw memory 516 stays the same as that of raw memory 216, which is n*Sc. However, the dimensions of raw memory 516 are changed in relation to those of raw memory 216, to allow for parallelization in decoder 500. Similarly, the dimensions of current memory 502 are (n/M)*(M*Sc). The dimensions of syndrome memory 510 do not change with parallelization, and remain p*Sc, where p is the number of circulants of the longest parity.

The dimensions of computing elements may change to allow for decoding of circulants in parallel. This may cause a small increase in size for decoder 500. However, this increase in size may not be proportional to the parallelization level. For example, a parallelization level of M=2 may not cause decoder 500 to increase in size by a factor of 2 when compared to decoder 200. This may be because the memories in decoder 500 do not change in size when compared to decoder 200. Shifters 506 and 512 may increase in size to become M*(column weight), to allow them to process multiple circulants in parallel. Similarly, in some embodiments, any of flipping module 514, adders 504 and 508, and exclusive-or element 520 may increase in size by a factor of M.

Flipping module 514 may use the instant syndrome "SHIFTED_SYND_ODD" in the odd portion of the decoding circuitry and the instant syndrome "SHIFTED_SYND_EVEN" in the even portion of the decoding circuitry. In some embodiments, the instant syndromes "SHIFTED_SYND_ODD" and "SHIFTED_SYND_EVEN" both may include information from circulants decoded in both the odd and even parts of the memory. Similarly, a convergence monitor for decoder 500 may also use the instant syndromes "SHIFTED_SYND_ODD" and "SHIFTED_SYND_EVEN" to determine if the odd and even codewords respectively have converged. The instant syndrome "SHIFTED_SYND_ODD" may be generated when shifter 512 shifts the instant syndrome from the previous cycle "PREV_SYND_ODD", and the same may be true for "SHIFTED_SYND_EVEN" and "PREV_SYND_EVEN". In some embodiments, the instant syndromes from the previous cycle "PREV_SYND_ODD" and "PREV_SYND_EVEN" may be identical for both the odd and even parts of decoder 500, and may be generated from a current instant syndrome "CURR_SYND". The current instant syndrome "CURR_SYND" may also be identical for both the odd and even parts of decoder 500. The current instant syndrome may also be used to generate temporary syndromes from the previous cycle "PREV_SYND_ODD" and "PREV_SYND_EVEN". Data paths that carry the instant syndromes "SHIFTED_SYND_ODD", "SHIFTED_SYND_EVEN", "PREV_SYND_ODD", "PREV_SYND_EVEN", "CURR_SYND", and "TEMP_SYND" may not change in size in decoder 500 as compared to decoder 200.

Data paths leading into and out of current memory 502, syndrome memory 510, and raw memory 516 may be increased in size to allow for parallel decoding of circulants. These data paths may be increased in size by a factor of M, where M is the parallelization level. For example, data path from current memory 502 to adder 504 may be doubled in size to allow it to carry two circulants simultaneously. Where decoder 200 had a single data path to carry "CURB_HD" from current memory 202 to adder 204, decoder 500 may have a data path twice as big to carry two circulants "CURR_HD_ODD" and "CURR_HD_EVEN" from current memory 502 to adder 504. Similarly, the data path that carried "NEW_HD" from adder 204 to current memory 202 in decoder 200 may be doubled in size to allow it to carry "NEW_HD_ODD" and "NEW_HD_EVEN" from adder 504 to current memory 502. Similarly, the data path that carried "SHIFTED_HD" from shifter 206 to adder 208 in decoder 200 may be doubled in size to allow it to carry "SHIFTED_HD_ODD" and "SHIFTED_HD_EVEN" from shifter 506 to adder 508.

Two new elements are illustrated in decoder 500 that were not present in decoder 200, to enable parallelization of decoding. In some embodiments, one or neither of these elements may be present in decoder 500. The first is the overlap detection and look-ahead circuitry represented by multiplexors 532 and 534, and adders 528 and 530. This circuitry may be used to create a current instant syndrome "CURR_SYND" that uses information from non-zero circulants that are decoded in parallel. The odd part of decoder 500 flips portions of a first circulant to create "NEW_HD_ODD" and shifts the flipped circulant to create "SHIFTED_HD_ODD". Similarly, the even part of decoder 500 flips portions of a second circulant to create "NEW_HD_EVEN" and shifts the flipped circulant to create "SHIFTED_HD_EVEN".

The first shifted flipped circulant "SHIFTED_HD_ODD" and the second shifted flipped circulant "SHIFTED_HD_EVEN" may contain different information that may be used to update the temporary instant syndrome from a previous cycle "TEMP_SYND" differently. For example, adder 508 may combine "TEMP_SYND" and "SHIFTED_HD_ODD" to produce "CURR_SYND_ODD", and may combine "TEMP_SYND" and "SHIFTED_HD_EVEN" to produce "CURR_SYND_EVEN". Adder 508 may output "CURR_SYND_ODD" through data path 524 and "CURR_SYND_EVEN" through data path 526. The current instant syndrome "CURR_SYND" may need to be generated by taking into account information from both "CURR_SYND_ODD" and "CURR_SYND_EVEN".

Multiplexor 532 may receive "CURR_SYND_ODD" at one input through data path 524 and a combination of "CURR_SYND_ODD" and "CURR_SYND_EVEN" created by adder 528 at another input. Multiplexor 532 may choose "CURR_SYND_ODD" to be the current instant syndrome "CURR_SYND" if it determines that "CURR_SYND_EVEN" does not contain useful information. "CURR_SYND_EVEN" may not contain useful information if the circulant decoded by the even part of decoder 500 was not a non-zero decoder. Multiplexor 532 may choose the combination of "CURR_SYND_ODD" and "CURR_SYND_EVEN" created by adder 528 to be the current instant syndrome "CURR_SYND" if it determines that both "CURR_SYND_ODD" and "CURR_SYND_EVEN" contain useful information. This may be because both the odd and even parts of decoder 500 decoded non-zero circulants. Multiplexor 534 may function in a similar manner to multiplexor 532. The combination of "CURR_SYND_ODD" and "CURR_SYND_EVEN" produced by adder 528 may be the same as the combination of "CURR_SYND_ODD" and "CURR_SYND_EVEN" produced by adder 530.

In some embodiments, an overlap comparator may be used in decoder 500 to ensure only one of multiplexors 532 and 534 writes the current instant syndrome "CURR_SYND" to syndrome memory 510. The overlap comparator may be a part of adder 508, or may be a separate element located between adder 504 and shifter 506, or between shifter 506 and adder 508. The overlap comparator may compare the row addresses corresponding to the locations of the two circulants to determine if the two circulants being processed in parallel belong to the same row in grid 100. If the two circulants belong to the same row, the overlap comparator may mark a flag to indicate the two circulants belong to the same row. Multiplexors 532 and 534 or syndrome memory 510 may check this flag to determine if only one of multiplexors 532 and 534 should write the current instant syndrome "CURR_SYND" to syndrome memory 510. Since the "CURR_SYND" output by multiplexors 532 and 534 is identical, this may reduce redundancy in decoder 500.

In some embodiments, computation redundancy may be reduced by only adding the temporary syndrome from the previous cycle "TEMP_SYND" once at adder 508, to either "SHIFTED_HD_ODD" or "SHIFTED_HD_EVEN". Decoder 500 may determine if the shifter offsets used by shifter 506 for "NEW_HD_ODD" and "NEW_HD_EVEN" contain the same value. If so, "TEMP_SYND" may be added to only one of "SHIFTED_HD_ODD" or "SHIFTED_HD_EVEN" to create "CURR_SYND", which is then stored in syndrome memory 510. In some embodiments, there may be as many shifter offsets for each circulant as the column weight of grid 100 which contains each circulant. For example, grid 100 may have a maximum of four non-zero circulants in each column, so the column weight of grid 100 may be four. Hence, there may be four shifter offsets for each circulant in grid 100. Reducing the write operations for syndrome memory 510 may result in a lower power consumption.

The second of the two new elements illustrated in decoder 500 that were not present in decoder 200 is circulant flag memory 522. This memory contains n entries, wherein n is the number of circulants of the longest codeword. The entries in circulant flag memory 522 indicate if a portion of a circulant has been flipped by flipping module 514. In some embodiments, these entries may be represented as flags. In some embodiments, circulant flag memory 522 may include information about how many bits in a circulant have been flipped, or how many times portions of a circulant have been flipped.

Circulant flag memory 522 may be accessed at a low rate to determine if the current circulant has been flipped in a previous decoding cycle. If the current circulant has been flipped, the original version of the circulant may be read from raw memory 516. The circulant may then be further updated through flipping and shifting by flipping module 514 and shifter 506 respectively. Using circulant flag memory 522 to determine whether to access raw memory 516 may reduce the number of accesses performed on raw memory 516. This may, in turn, reduce the power consumption of decoder 500.

In some embodiments, information from circulant flag memory 522 may be used in conjunction with thresholds for flipping module 514. For example, circulant flag memory 522 may contain information about the number of bits in a circulant that have been flipped, or the number of times a circulant has had its portions flipped. This information may be compared with thresholds at flipping module 514 to determine if the circulant should be flipped. If the number of times a circulant has been flipped is higher than the threshold at flipping module 514, the circulant may not be flipped in future decoding cycles. In some embodiments, the threshold set at flipping module 514 may be based on information from circulant flag memory 522.

In comparison to decoder 200, decoder 500 may have different performance characteristics. For example, if decoder 200 and decoder 500 use the same clock frequency while decoding, decoder 500 may have a gain in throughput proportional to its parallelization level of M=2 without a gain in area proportional to its parallelization level. If the throughput of decoder 200 and decoder 500 are matched to each other, decoder 500 may have lower power consumption and a low gain in area.

FIG. 6 shows a flow diagram of a process for decoding codewords incorporating embodiments of the present disclosure. Process 600 includes block 602, in which a decoder determines whether a first location in a second dimension of a first circulant of a first codeword corresponds to a second location in the second dimension of a second circulant of a second codeword. The first and second codewords may be arranged as columns in a matrix. The first and second locations in the second dimension may be first and second row numbers of the first and second circulants in a matrix. The first and second row numbers may correspond to row numbers in grid 100. The storage circuitry, such as raw memory 516, that stores the first and second circulant may correspond to grid 100. The decoder may process the first and second circulants simultaneously. The decoder may determine if the first and second circulants belong to the same row in grid 100 by using an overlap comparator as discussed in relation to FIG. 5. The decoder may also determine if the first and second circulants belong to the same row in grid 100 by using multiplexors 532 or 534 as discussed in relation to FIG. 5, or any other element of decoder 500.

Process 600 includes block 604, in which the decoder, in response to determining that the first location does not correspond to the second location, decodes the first circulant and the second circulant in accordance with a first decoding process. This may indicate that the first and second circulant are not stored in the game row of grid 100. The first decoding process may comprise not combining "CURR_SYND_ODD" and "CURR_SYND_EVEN" at adders 528 and 530. The first decoding process may comprise not choosing the results of adders 528 and 530 at multiplexors 532 and 534 respectively when determining the current instant syndrome value "CURR_SYND". By doing this, the odd and even parts of decoder 500 may effectively work separately. This may lead to a correct decoding as the first and second circulant do not share a row, and hence the current instant syndrome "CURR_SYND" does not need information from the decoding of both circulants to have the correct value.

Process 600 includes block 606, in which the decoder, in response to determining that the first location corresponds to the second location, decodes the first circulant and the second circulant in accordance with a second decoding process. This may indicate that the first and second circulants are stored in the same row of grid 100. The second decoding process may comprise combining "CURR_SYND_ODD" and "CURR_SYND_EVEN" at adders 528 and 530 and choosing the resulting combination at multiplexors 532 and 534 to create the current instant syndrome value "CURR_SYND". In this decoding process, information from both the first and second circulants which are decoded in parallel is used to generate the current instant syndrome.

The methods and systems discussed in this application may be implemented at least partially on transitory or non-transitory computer-readable media having transitory or non-transitory computer-readable instructions stored thereon.

While various embodiments of the present disclosure have been shown and described herein, it will be obvious to those skilled in the art that such embodiments are described by way of example only. Numerous variations, changes, and substitutions will now occur to those skilled in the art without departing from this disclosure. It should be understood that various alternatives to the embodiments of the disclosure described herein may be employed in practicing the disclosure. It is intended that the following claims define the scope of the disclosure and that methods and systems within the scope of these claims and their equivalents be covered thereby.

What is claimed is:

1. A method for decoding codewords stored in a memory unit, wherein codewords comprise at least one circulant and are stored in a first dimension of a matrix in the memory unit, and wherein each circulant in a codeword is associated with a location in a second dimension in the matrix in the memory unit, the method comprising:

determining, by an overlap comparator on a decoder circuit, whether a first memory location in a second dimension of a first circulant of a first codeword stored in the memory unit corresponds to a second memory location in the second dimension of a second circulant of a second codeword stored in the memory unit;

in response to determining that the first memory location does not correspond to the second memory location, decoding, by a flipping element on the decoder circuit, the first circulant based on an odd current instant syndrome obtained from a syndrome memory unit; and in response to determining that the first memory location corresponds to the second memory location, decoding, by a multiplexor on the decoder circuit, the first circulant and the second circulant based on the odd current instant syndrome and an even current instant syndrome obtained from the syndrome memory unit.

2. The method of claim 1, wherein determining whether the first memory location corresponds to the second memory location further comprises comparing a first address of the first memory location of the first circulant and a second address of the second memory location of the second circulant.

3. The method of claim 1, further comprising:
retrieving a third circulant of the first codeword from a raw memory;
generating flips by the flipping element, in the first circulant based on an instant syndrome and the third circulant; and
storing the first circulant in a current memory.

4. The method of claim 1, further comprising:
generating flips by the flipping element in the first circulant;
receiving an old instant syndrome; and
generating a current instant syndrome based on the old instant syndrome and the first circulant.

5. The method of claim 1, further comprising:
decoding the first codeword in parallel with the second codeword, wherein the first codeword is decoded using an odd portion of the decoder circuit and the second codeword is decoded using an even portion of the decoder circuit.

6. The method of claim 1, further comprising:
generating a combined current instant syndrome based on the odd current instant syndrome and the even current instant syndrome.

7. The method of claim 1, further comprising:
determining if a first offset for the odd current instant syndrome corresponds to a second offset for the even current instant syndrome; and
in response to determining that the first offset corresponds to the second offset, generating a combined current instant syndrome based on one of the odd current instant syndrome and the even current instant syndrome.

8. The method of claim 1, further comprising:
determining if the first circulant has been flipped based on a value of a flag; and
in response to determining that the first circulant has been flipped, retrieving a third circulant of the first codeword from a raw memory.

9. The method of claim 1, further comprising:
generating a threshold value based on a value of a flag associated with the first circulant; and
determining whether to flip a value of the first circulant based on the threshold value.

10. The method of claim 1, further comprising:
receiving the first circulant and the second circulant simultaneously from an odd portion and an even portion respectively of a memory through a data path.

11. A system for decoding codewords stored in a memory unit, wherein codewords comprise at least one circulant and are stored in a first dimension of a matrix in the memory unit, and wherein each circulant in a codeword is associated with a location in a second dimension in the matrix in the memory unit, the system comprising: the memory unit configured to store a first circulant of a first codeword and a second circulant of a second codeword; a syndrome memory unit configured to store an odd current instant syndrome and an even current instant syndrome; and a decoder circuit including: an overlap comparator configured to determine whether a first memory location in a second dimension of the first circulant of the first codeword corresponds to a second memory location in the second dimension of the second circulant of the second codeword, a flipping element configured to in response to determining that the first memory location does not correspond to the second memory location, decode the first circulant based on the odd current instant syndrome obtained, and a multiplexor configured to in response to determining that the first memory location corresponds to the second memory location, decode the first circulant and the second circulant based on the odd current instant syndrome and the even current instant syndrome obtained from the syndrome memory unit.

12. The system of claim 11, wherein the overlap comparator is further configured to, when determining whether the first memory location corresponds to the second memory location, compare a first address of the first memory location of the first circulant and a second address of the second memory location of the second circulant.

13. The system of claim 11, wherein the flipping element is further configured to:
retrieve a third circulant of the first codeword from a raw memory;
generate flips in the first circulant based on an instant syndrome and the third circulant; and
store the first circulant in a current memory.

14. The system of claim 11, wherein the flipping element is further configured to:
generate flips in the first circulant;
receive an old instant syndrome; and
generate a current instant syndrome based on the old instant syndrome and the first circulant.

15. The system of claim 11, wherein the decoder circuit further includes circuitry configured to:
decode the first codeword in parallel with the second codeword, wherein the first codeword is decoded using an odd portion of the decoder circuit and the second codeword is decoded using an even portion of the decoder circuit.

16. The system of claim 11, wherein the multiplexor is further configured to: generate a combined current instant syndrome based on the odd current instant syndrome and the even current instant syndrome.

17. The system of claim 11, wherein the multiplexor is further configured to:
determine if a first offset for the odd current instant syndrome corresponds to a second offset for the even current instant syndrome; and
in response to determining that the first offset corresponds to the second offset, generate a combined current instant syndrome based on one of the odd current instant syndrome and the even current instant syndrome.

18. The system of claim 11, wherein the decoder circuit further includes circuitry configured to:

determine if the first circulant has been flipped based on a value of a flag; and in response to determining that the first circulant has been flipped, retrieve a third circulant of the first codeword from a raw memory.

19. The system of claim 11, wherein the decoder circuit further includes circuitry configured to:

generate a threshold value based on a value of a flag associated with the first circulant; and determine whether to flip a value of the first circulant based on the threshold value.

20. The system of claim 11, wherein the decoder circuit further includes circuitry configured to: receive the first circulant and the second circulant simultaneously from an odd portion and an even portion respectively of the memory unit through a data path.

* * * * *